United States Patent

Iwamoto

[11] Patent Number: 5,572,169
[45] Date of Patent: Nov. 5, 1996

[54] TEMPERATURE-COMPENSATED PIEZOELECTRIC OSCILLATOR

[75] Inventor: Hiroyuki Iwamoto, Tokyo, Japan

[73] Assignee: NEC Corporation, Tokyo, Japan

[21] Appl. No.: 568,976

[22] Filed: Dec. 7, 1995

[30] Foreign Application Priority Data

Dec. 9, 1994 [JP] Japan ................................. 6-306227

[51] Int. Cl.⁶ ............................. H03B 5/04; H03B 5/32; H03L 1/02; H03L 7/00
[52] U.S. Cl. ........................... 331/176; 331/1 R; 331/17; 331/158
[58] Field of Search ................................ 331/1 R, 17, 66, 331/158, 176; 310/315, 318; 327/48; 364/557; 374/100, 117, 163; 377/25

[56] References Cited

U.S. PATENT DOCUMENTS

| | | | |
|---|---|---|---|
| 4,371,271 | 2/1983 | Bellet | 374/183 |
| 4,537,515 | 8/1985 | Dinger et al. | 331/66 X |
| 4,558,456 | 12/1985 | Bezard et al. | 377/25 |
| 4,872,124 | 10/1989 | Shimizu et al. | 377/25 X |
| 5,442,669 | 8/1995 | Medin | 377/25 X |

*Primary Examiner*—David Mis
*Attorney, Agent, or Firm*—Scully, Scott, Murphy & Presser

[57] ABSTRACT

A temperature-compensated piezoelectric oscillator includes a voltage-controlled piezoelectric oscillator, a first frequency divider, a second frequency divider, and a controller. The voltage-controlled piezoelectric oscillator has an output frequency controlled by a control voltage and oscillates the output frequency having a center frequency $f_0$ at an ambient temperature of $t_0$. The first frequency divider frequency-divides the output frequency from the voltage-controlled piezoelectric oscillator by N to output a first divided output frequency. The second frequency divider frequency-divides the output frequency from the voltage-controlled piezoelectric oscillator by M to output a second divided output frequency. The controller controls the control voltage to be applied to the voltage-controlled piezoelectric oscillator on the basis of a frequency difference between the first and second divided output frequencies upon a variation in ambient temperature of $t_0$ to keep the output frequency of the voltage-controlled piezoelectric oscillator at the center frequency $f_0$.

6 Claims, 1 Drawing Sheet

TEMPERATURE-COMPENSATED PIEZOELECTRIC OSCILLATOR

BACKGROUND OF THE INVENTION

The present invention relates to a temperature-compensated piezoelectric oscillator which oscillates a constant output frequency regardless of variations in ambient temperature.

FIG. 2 shows a conventional digital temperature-compensated piezoelectric oscillator (microcomputer-controlled piezoelectric oscillator). This temperature-compensated piezoelectric oscillator comprises a temperature sensor 9, an A/D converter 5 for converting an analog output from the temperature sensor 9 into a digital code to output it, a microcomputer circuit 6 and a memory circuit 7 which receive the digital code output from the A/D converter 5, a D/A convertor 8 for converting an output digital code from the microcomputer circuit 6 into an analog voltage to output it, and a voltage-controlled piezoelectric oscillator 1 for receiving the analog voltage output from the D/A convertor 8.

In the temperature-compensated piezoelectric oscillator having this arrangement, the temperature sensor 9 detects an ambient temperature T of the voltage-controlled piezoelectric oscillator 1 as an analog voltage. The A/D converter 5 converts the detected ambient temperature T into a digital code to output it to the microcomputer circuit 6 and the memory circuit 7. The microcomputer circuit 6 calculates compensation data for the ambient temperature T at that time on the basis of a program and constant which are prestored in the memory circuit 7 to compensate the frequency/temperature characteristics of the voltage-controlled piezoelectric oscillator 1. The output digital code is supplied to the D/A convertor 8. The D/A convertor 8 converts the output digital code from the microcomputer circuit 6 into an analog voltage to supply it to the voltage-controlled piezoelectric oscillator 1.

With this arrangement, an output frequency F from the voltage-controlled piezoelectric oscillator 1 can always be kept constant regardless of a change in ambient temperature T.

In this conventional temperature-compensated piezoelectric oscillator, however, when the ambient temperature T abruptly changes, a temperature difference occurs between a piezoelectric element in the voltage-controlled piezoelectric oscillator 1 and the temperature sensor 9. For this reason, accurate temperature compensation is not performed to degrade frequency stability.

SUMMARY OF THE INVENTION

It is an object of the present invention to provide a temperature-compensated piezoelectric oscillator in which accurate temperature compensation is performed even with an abrupt change in ambient temperature not to affect frequency stability.

In order to achieve the above object, according to the present invention, there is provided a temperature-compensated piezoelectric oscillator comprising voltage-controlled piezoelectric oscillation means, having an output frequency controlled by a control voltage, for oscillating the output frequency having a center frequency $f_0$ at an ambient temperature of $t_0$, first frequency division means for frequency-dividing the output frequency from the voltage-controlled piezoelectric oscillation means by N to output a first divided output frequency, second frequency division means for frequency-dividing the output frequency from the voltage-controlled piezoelectric oscillation means by M to output a second divided output frequency, and control means for controlling the control voltage to be applied to the voltage-controlled piezoelectric oscillation means on the basis of a frequency difference between the first and second divided output frequencies upon a variation in ambient temperature of $t_0$ to keep the output frequency of the voltage-controlled piezoelectric oscillation means at the center frequency $f_0$.

DESCRIPTION OF THE PREFERRED EMBODIMENT

Figure 1:
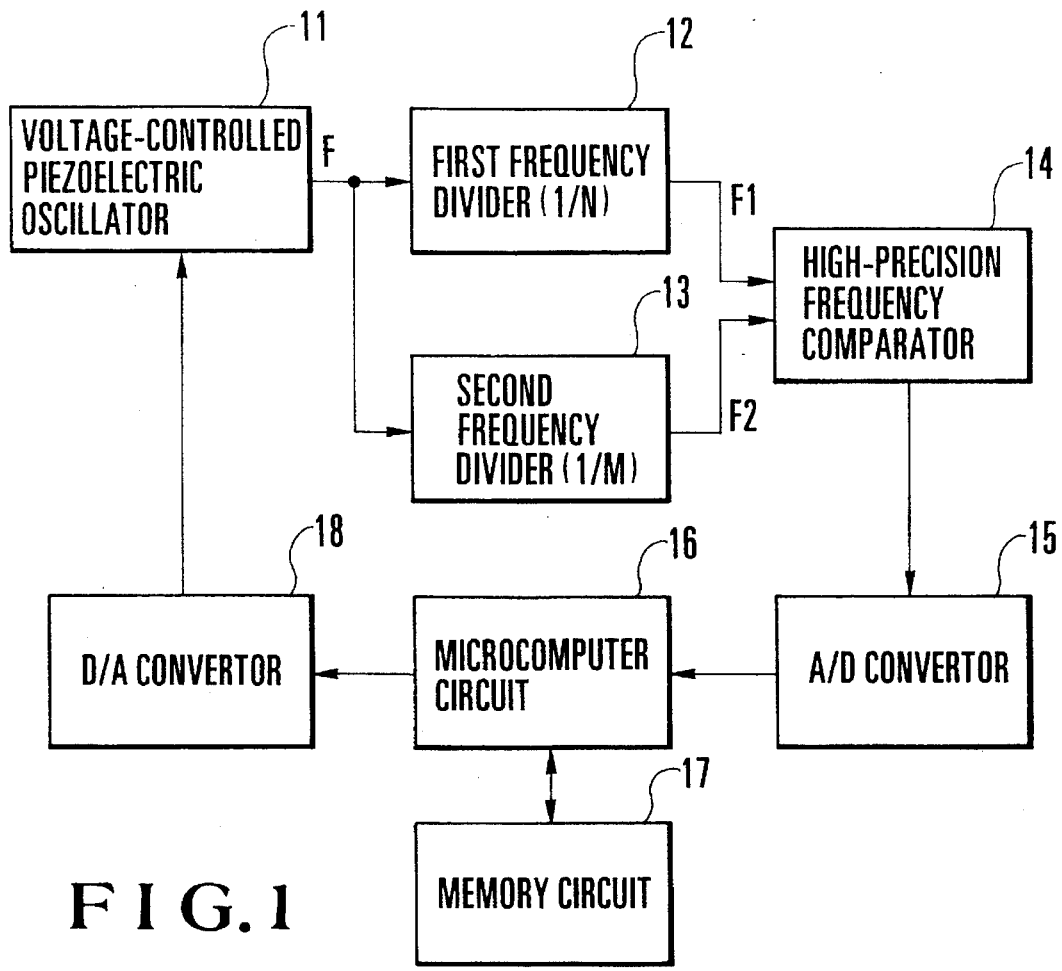
FIG. 1 is a block diagram showing a temperature-compensated piezoelectric oscillator according to an embodiment of the present invention.
Figure 2:
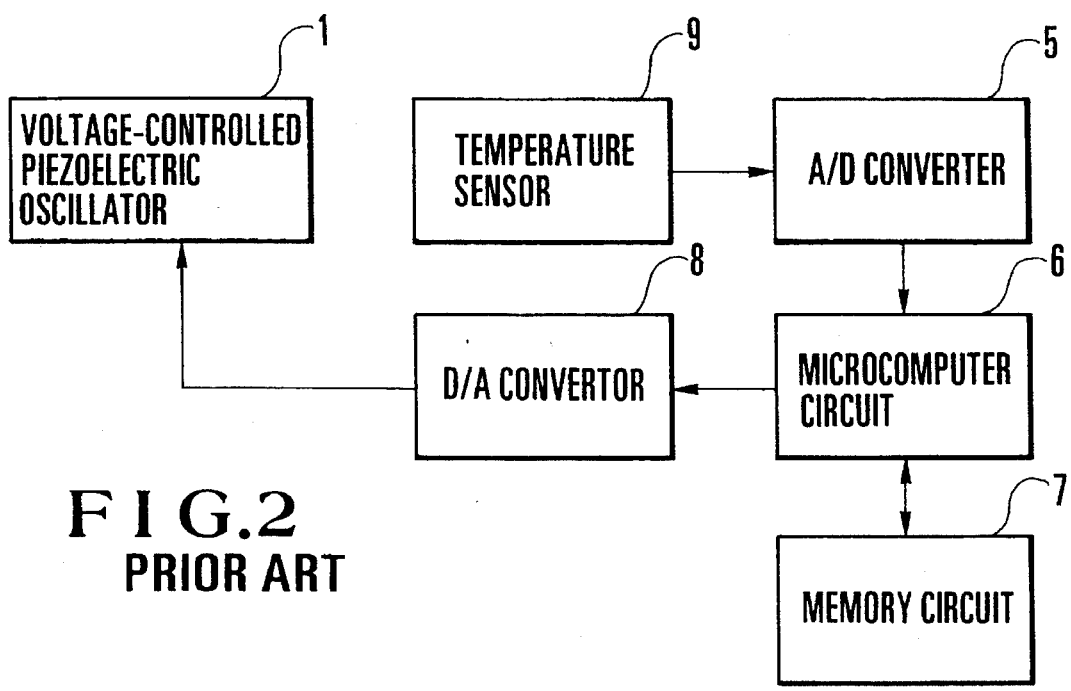
FIG. 2 is a block diagram showing a conventional temperature-compensated piezoelectric oscillator.

An embodiment of the present invention will be described below in detail. FIG. 1 shows a temperature-compensated piezoelectric oscillator according to the embodiment of the present invention.

The temperature-compensated piezoelectric oscillator of this embodiment comprises a first frequency divider 12 for frequency-dividing an output frequency F from a voltage-controlled piezoelectric oscillator 11 by N to obtain a first divided output frequency F1, a second frequency divider 13 for frequency-dividing the output frequency F from the voltage-controlled piezoelectric oscillator 11 by M to obtain a second divided output frequency F2, and a high-precision frequency comparator 14 for outputting an analog voltage in accordance with a frequency difference between the first and second divided output frequencies F1 and F2. The analog voltage output from the high-precision frequency comparator 14 is applied to an A/D convertor 15.

An output frequency $F(t_0)$ from the voltage-controlled piezoelectric oscillator 11 at an ambient temperature T of $t_0$ is defined as a center frequency $f_0$. A frequency difference between the first and second divided output frequencies $F1(t_0)$ and $F2(t_0)$ at that time is prestored as a reference value in a memory circuit 17.

More specifically, the output frequency F from the voltage-controlled piezoelectric oscillator 11 at the ambient temperature T of $t_0$ is defined as $F(t_0)=f_0$, and $f_0$ is defined as the center frequency of the voltage-controlled piezoelectric oscillator 11. In this case, the first divided output frequency F1 of the frequency divider 12 is $$F1(t_0)=f_0/N$$

and, the second divided output frequency F2 of the frequency divider 13 is $$F2(t_0)=f_0/M$$

The first and second divided output frequencies $F1(t_0)$ and $F2(t_0)$ are input to the high-precision frequency comparator 14.

A frequency difference $D(t_0)$ between the first and second divided output frequencies $F1(t_0)$ and $F2(t_0)$ input to the high-precision frequency comparator 14 is obtained by $$D(t_0) = f_0/N - f_0/M$$

In accordance with this frequency difference $D(t_0)$, the high-precision frequency comparator 14 outputs an analog voltage:

$$V(t_0) = G\{D(t_0)\}$$

This analog voltage $V(t_0)$ is converted by the A/D convertor 15 into a digital code:

$$A(t_0) = H\{V(t_0)\}$$

The obtained digital code is input to a microcomputer circuit 16 and the memory circuit 17.

The memory circuit 17 stores, as a reference value, the input digital code $A(t_0)$, i.e., the frequency difference between the first and second divided output frequencies $F1(t_0)$ and $F2(t_0)$ at the ambient temperature T of $t_0$ by the microcomputer 16.

Assume that the ambient temperature T is kept at $t$, and the output frequency F from the voltage-controlled piezoelectric oscillator 11 is at $f_0$. If the ambient temperature T changes from this state to $t+\Delta t$, and the output frequency F from the voltage-controlled piezoelectric oscillator 11 changes to $$F(t+\Delta t) = f_0 + \Delta f$$

the first divided output frequency F1 is $$F1(t+\Delta t) = (f_0 + \Delta f)/N$$

and the second divided output frequency F2 is $$F2(t+\Delta t) = (f_0 + \Delta f)/M$$

The frequency difference $D(t+\Delta t)$ between the first and second divided output frequencies $F1(t+\Delta t)$ and $F2(t+\Delta t)$ is $$\begin{aligned}D(t+\Delta t) &= (f_0+\Delta f)/N - (f_0+\Delta f)/M \\ &= D(t_0) + \Delta f \times (1/N - 1/M)\end{aligned}$$

In accordance with the frequency difference $D(t+\Delta t)$, the high-precision frequency comparator 14 outputs an analog voltage:

$$V(t+\Delta t) = G\{D(t_0) + \Delta f \times (1/N - 1/M)\}$$

This analog voltage is converted by the A/D convertor 15 into a digital code:

$$A(t+\Delta t) = H\{V(t+\Delta t)\}$$

The obtained digital code is input to the microcomputer circuit 16 and the memory circuit 17.

The microcomputer circuit 16 calculates a change amount $\Delta f$ of the output frequency F from the voltage-controlled piezoelectric oscillator 11 with respect to the center frequency $f_0$ on the basis of the reference value $A(t_0)$ stored in the memory circuit 17 and the digital code $A(t+\Delta t)$ from the A/D convertor 15. Next, the microcomputer circuit 16 calculates an analog voltage in accordance with this change amount $\Delta f$ to supply the output digital code to a D/A convertor 18. The D/A convertor 18 converts the output digital code from the microcomputer circuit 16 into an analog voltage to supply it to the voltage-controlled piezoelectric oscillator 11.

With this operation, the output frequency F from the voltage-controlled piezoelectric oscillator 11 can always be kept at the center frequency $f_0$ regardless of a change in ambient temperature T. In this embodiment, the change amount $\Delta f$ of the output frequency F from the voltage-controlled piezoelectric oscillator 11 with respect to the center frequency $f_0$ is calculated on the basis of the frequency difference between the first and second divided output frequencies F1 and F2. Even if the ambient temperature T abruptly changes, the change amount $\Delta f$ of the output frequency F from the voltage-controlled piezoelectric oscillator 11 can be instantaneously calculated to immediately keep the output frequency F at the center frequency $f_0$.

As is apparent from the above description, according to the present invention, when the output frequency F from the voltage-controlled piezoelectric oscillator changes upon a change in ambient temperature T, a difference between the first and second divided output frequencies F1 and F2 also changes. On the basis of this difference between the first and second divided output frequencies F1 and F2, the output frequency F from the voltage-controlled piezoelectric oscillator is kept at the center frequency $f_0$. Since the change amount $\Delta f$ of the output frequency F from the voltage-controlled piezoelectric oscillator is detected instantaneously, accurate temperature compensation can be performed even upon an abrupt change in ambient temperature T not to degrade frequency stability.

When the output frequency F from the voltage-controlled piezoelectric oscillator changes upon a change in ambient temperature T, a difference between the first and second divided output frequencies F1 and F2 changes. The output frequency F from the voltage-controlled piezoelectric oscillator is kept at the center frequency $f_0$ on the basis of a prestored reference value (a difference between the first divided output frequency F1 ($F1=f_0/N$) and the second divided output frequency F2 ($F2=f_0/M$) at the ambient temperature T of $t_0$) and a difference between the first divided output frequency F1 ($F1=(f_0+\Delta f)/N$) and the second divided output frequency F2 ($F2=(f_0+\Delta f)/M$). Since the change amount of the output frequency F from the voltage-controlled piezoelectric oscillator is detected instantaneously, accurate temperature compensation can be performed even upon an abrupt change in ambient temperature T not to degrade frequency stability.

When the output frequency F from the voltage-controlled piezoelectric oscillator changes upon a change in ambient temperature T, a difference between the first and second divided output frequencies F1 and F2 changes. The change amount $\Delta f$ of the output frequency F from the voltage-controlled piezoelectric oscillator with respect to the center frequency $f_0$ is calculated on the basis of a prestored reference value (a difference between the first divided output frequency F1 ($F1=f_0/N$) and the second divided output frequency F2 ($F2=f_0/M$) at the ambient temperature T of $t_0$) and a difference between the first divided output frequency F1 ($F1=(f_0+\Delta f)/N$) and the second divided output frequency F2 ($F2=(f_0+\Delta f)/M$). An analog voltage in accordance with this change amount $\Delta f$ is applied to the voltage-controlled piezoelectric oscillator to keep the output frequency F from the voltage-controlled piezoelectric oscillator at the center frequency $f_0$. Since the change amount $\Delta f$ of the output frequency F from the voltage-controlled piezoelectric oscillator is detected instantaneously, accurate temperature compensation can be performed even upon an abrupt change in ambient temperature T not to degrade frequency stability.

What is claimed is:

1. A temperature-compensated piezoelectric oscillator comprising:

voltage-controlled piezoelectric oscillation means, having an output frequency controlled by a control voltage, for oscillating the output frequency having a center frequency $f_0$ at an ambient temperature of $t_0$;

first frequency division means for frequency-dividing the output frequency from said voltage-controlled piezoelectric oscillation means by N to output a first divided output frequency;

second frequency division means for frequency-dividing the output frequency from said voltage-controlled piezoelectric oscillation means by M to output a second divided output frequency; and control means for controlling the control voltage to be applied to said voltage-controlled piezoelectric oscillation means on the basis of a frequency difference between the first and second divided output frequencies upon a variation in ambient temperature of $t_0$ to keep the output frequency of said voltage-controlled piezoelectric oscillation means at the center frequency $f_0$.

2. An oscillator according to claim 1, further comprising storage means for storing a frequency difference between the first and second divided output frequencies at the ambient temperature of $t_0$ as a reference value, so that said control means calculates a value of the control voltage to be applied to said voltage-controlled piezoelectric oscillation means on the basis of the reference value read out from said storage means and the frequency difference between the first and second divided output frequencies upon the variation in ambient temperature of $t_0$.

3. An oscillator according to claim 2, wherein said control means obtains a change amount $\Delta f$ of the output frequency from said voltage-controlled piezoelectric oscillation means with respect to the center frequency $f_0$ to calculate the value of the control voltage in accordance with $\Delta f(1/N-1/M)$.

4. An oscillator according to claim 1, further comprising frequency comparison means for comparing the first and second divided output frequencies to each other to obtain a frequency difference.

5. An oscillator according to claim 4, further comprising an A/D convertor for converting an analog voltage representing the frequency difference output from said frequency comparison means into a digital code, and D/A conversion means for converting a digital code representing the control voltage output from said control means into an analog voltage, and wherein said control means is constituted by a microcomputer.

6. A temperature-compensated piezoelectric oscillator comprising:

a voltage-controlled piezoelectric oscillator having an output frequency controlled by a control voltage to oscillate the output frequency having a center frequency $f_0$ at an ambient temperature of $t_0$;

a first frequency divider for frequency-dividing the output frequency from said voltage-controlled piezoelectric oscillator by N to output a first divided output frequency;

a second frequency divider for frequency-dividing the output frequency from said voltage-controlled piezoelectric oscillator by M to output a second divided output frequency;

a high-precision frequency comparator for comparing the first and second divided output frequencies to each other to output an analog voltage in accordance with a frequency difference;

an A/D converter for converting the analog voltage from said high-precision frequency comparator into a digital code;

a memory for storing a frequency difference between the first and second divided output frequencies at the ambient temperature of $t_0$ as a reference value;

a microcomputer for obtaining a change amount of the output frequency from said voltage-controlled piezoelectric oscillator with respect to the center frequency $f_0$ on the basis of the reference value read from said memory and the digital code from said A/D convertor to output a digital code in accordance with the change amount; and a D/A convertor for converting the digital code output from said microcomputer into an analog voltage to apply the analog voltage to said voltage-controlled piezoelectric oscillator as the control voltage, wherein said microcomputer outputs the control voltage to be applied to said voltage-controlled piezoelectric oscillator through said D/A convertor to keep the output frequency from said voltage-controlled piezoelectric oscillator at the center frequency $f_0$.

* * * * *

UNITED STATES PATENT AND TRADEMARK OFFICE
CERTIFICATE OF CORRECTION

PATENT NO. : 5,572,169
DATED : November 5, 1996
INVENTOR(S) : Hiroyuki Iwamoto

It is certified that error appears in the above-indentified patent and that said Letters Patent is hereby corrected as shown below:

Column 4, line 45: "amount of the" should read --amount $\triangle$ f of the--

Signed and Sealed this

Fifth Day of August, 1997

Attest:

BRUCE LEHMAN

Attesting Officer

Commissioner of Patents and Trademarks